United States Patent
Wu

(10) Patent No.: US 11,919,054 B2
(45) Date of Patent: Mar. 5, 2024

(54) CLEANING DEVICE AND METHOD OF CLEANING NOZZLE

(71) Applicant: CHANGXIN MEMORY TECHNOLOGIES, INC., Hefei (CN)

(72) Inventor: Qilong Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/809,660

(22) Filed: Jun. 29, 2022

(65) Prior Publication Data

US 2023/0226579 A1 Jul. 20, 2023

Related U.S. Application Data

(63) Continuation of application No. PCT/CN2022/089249, filed on Apr. 26, 2022.

(30) Foreign Application Priority Data

Jan. 17, 2022 (CN) .......................... 202210047574.9

(51) Int. Cl.
*B08B 9/00* (2006.01)
*G03F 7/30* (2006.01)

(52) U.S. Cl.
CPC . *B08B 9/00* (2013.01); *G03F 7/30* (2013.01)

(58) Field of Classification Search
CPC .................................... B08B 9/00; G03F 7/30
USPC ....................................................... 134/94.1
See application file for complete search history.

(56) References Cited

U.S. PATENT DOCUMENTS

| 2001/0037819 | A1 | 11/2001 | Mitsumori et al. |
| 2005/0045207 | A1 | 3/2005 | Nitta et al. |
| 2005/0069812 | A1* | 3/2005 | Maemoto .............. B41C 1/1008 |
| | | | 430/270.1 |

FOREIGN PATENT DOCUMENTS

| CN | 106513355 | A | * | 3/2017 | ............. B08B 13/00 |
| CN | 106513355 | A | | 3/2017 | |
| CN | 108453084 | A | * | 8/2018 | ............. B08B 13/00 |
| CN | 108453084 | A | | 8/2018 | |
| CN | 108717251 | A | | 10/2018 | |
| CN | 109663775 | A | | 4/2019 | |
| CN | 214832249 | U | | 11/2021 | |

OTHER PUBLICATIONS

International Search Report cited in PCT/CN2022/089249 dated Sep. 2, 2022, 9 pages.

* cited by examiner

*Primary Examiner* — Tinsae B Ayalew
(74) *Attorney, Agent, or Firm* — Cooper Legal Group, LLC

(57) ABSTRACT

Embodiments of the present disclosure relate to a cleaning device and a method of cleaning a nozzle, and relate to the technical field of semiconductor manufacturing. The cleaning device includes: a body configured to surround the nozzle, where the body includes a body inlet and a body outlet; and at least one row of first runners configured to introduce a cleaning agent, where the first runners are arranged along an outer circumference of the body, an outlet of each of the first runners communicates with the body, and a cleaning position is formed at the outlet of the first runner.

16 Claims, 5 Drawing Sheets

CLEANING DEVICE AND METHOD OF CLEANING NOZZLE

CROSS-REFERENCE TO RELATED APPLICATIONS

This is a continuation of International Application No. PCT/CN2022/089249, filed on Apr. 26, 2022, which claims the priority to Chinese Patent Application No. 202210047574.9, titled "CLEANING DEVICE AND METHOD OF CLEANING NOZZLE" and filed on Jan. 17, 2022. The entire contents of International Application No. PCT/CN2022/089249 and Chinese Patent Application No. 202210047574.9 are incorporated herein by reference.

TECHNICAL FIELD

Embodiments of the present disclosure relate to, but are not limited to, a cleaning device and a method of cleaning a nozzle.

BACKGROUND

In a process of manufacturing a semiconductor device, wafers are generally processed by spraying corresponding reagents through various nozzles. For example, in a photolithography process, a developer is sprayed onto a wafer surface through a developing nozzle. Liquid outlet ends of these nozzles are close to the wafers, and mixture on wafer surfaces splash and adhere to these nozzles and their surroundings, causing contamination. In actual production, shutdown maintenance or regular shutdown maintenance is performed according to actual product defect results to wipe and clean the nozzles. However, such cleaning is not sufficient; instead, it seriously affects a product yield and machine productivity.

SUMMARY

An overview of the subject matter detailed in the present disclosure is provided below, which is not intended to limit the protection scope of the claims.

A first aspect of the present disclosure provides a cleaning device of a nozzle, where the cleaning device of the nozzle includes:
  a body configured to surround the nozzle, where the body includes a body inlet and a body outlet; and
  at least one row of first runners configured to introduce a cleaning agent, where the first runners are arranged along an outer circumference of the body, an outlet of each of the first runners communicates with the body, and a cleaning position is formed at the outlet of the first runner.

A second aspect of embodiments of the present disclosure provides a method of cleaning a nozzle, where the method of cleaning a nozzle includes:
  placing the nozzle into a cleaning position of a body along a body inlet of the body, where the body surrounds the nozzle;
  introducing at least one row of cleaning agents into the body from an outer circumference of the body, and cleaning the nozzle from the cleaning position; and
  discharging the cleaning agent through a body outlet.

Other aspects of the present disclosure are understandable upon reading and understanding of the accompanying drawings and detailed description.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may derive other accompanying drawings based on these accompanying drawings without creative efforts.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other is embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

The embodiments of the present disclosure provide a cleaning device and a method of cleaning a nozzle, mainly for various nozzles used in a semiconductor manufacturing process, such as supply nozzles for a photoresist, supply nozzles for a developer, and supply nozzles for a cleaning solution. In the embodiments of the present disclosure, a flowing cleaning agent is used to adequately clean contaminants adhering to the exterior of the nozzle, and then a flowing drying agent is used to clean a liquid cleaning agent and other residues on the exterior of the nozzle, to achieve dynamic cleaning of a surface of the nozzle and ensure cleanliness of the surface of the nozzle, thereby ensuring a product production yield, improving cleaning efficiency, and thus improving production efficiency.

Figure 1:
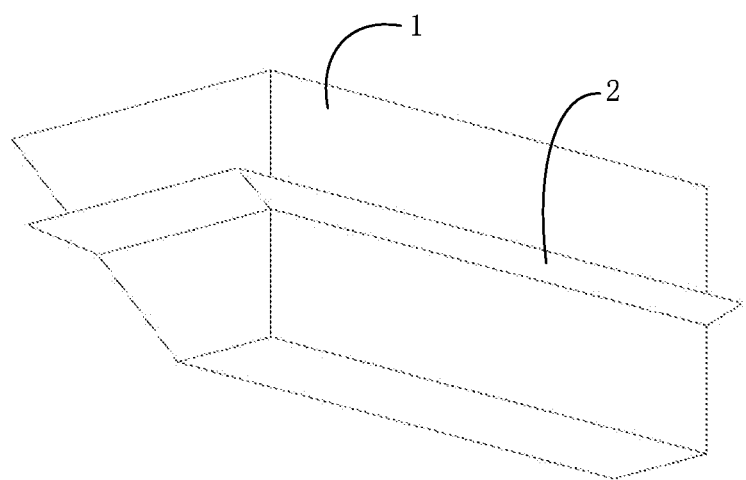
FIG. 1 is a schematic structural diagram of a cleaning device according to an exemplary embodiment.
Figure 2:
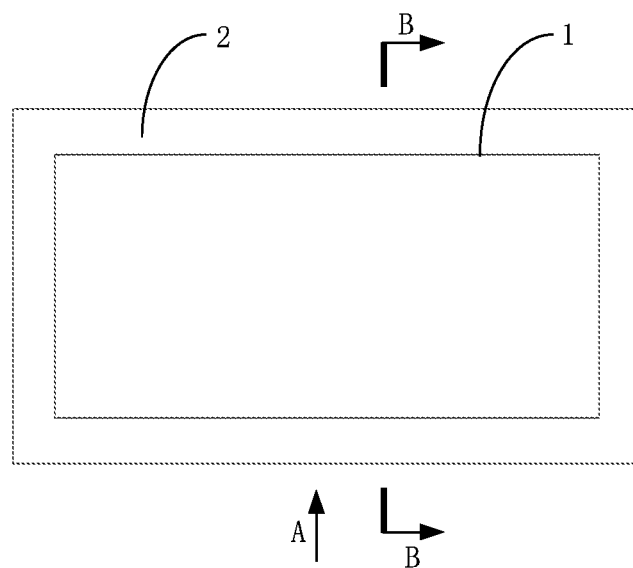
FIG. 2 is a top view of FIG. 1 according to an exemplary embodiment.
Figure 3:
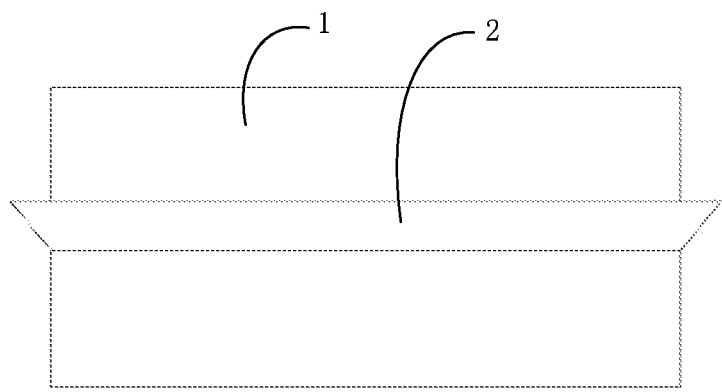
FIG. 3 is a view of FIG. 2 from a perspective of A according to an exemplary embodiment.
Figure 4:
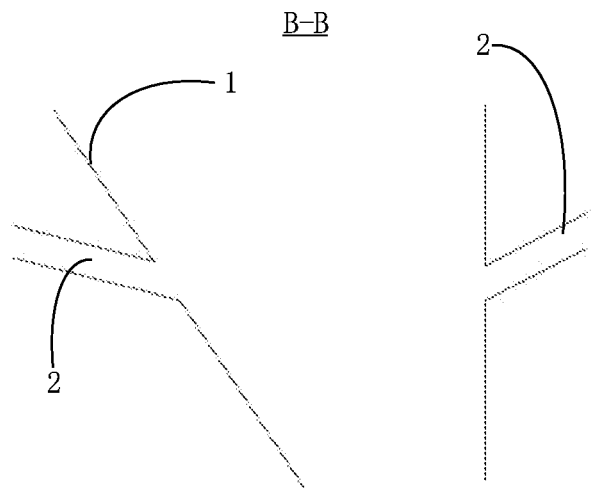
FIG. 4 to FIG. 6 are each a cross-sectional view of the cleaning device along B-B according to an exemplary embodiment.
Figure 5:
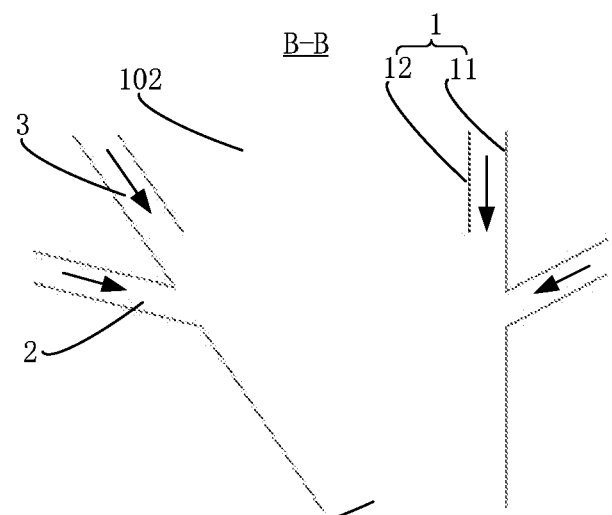
Figure 6:
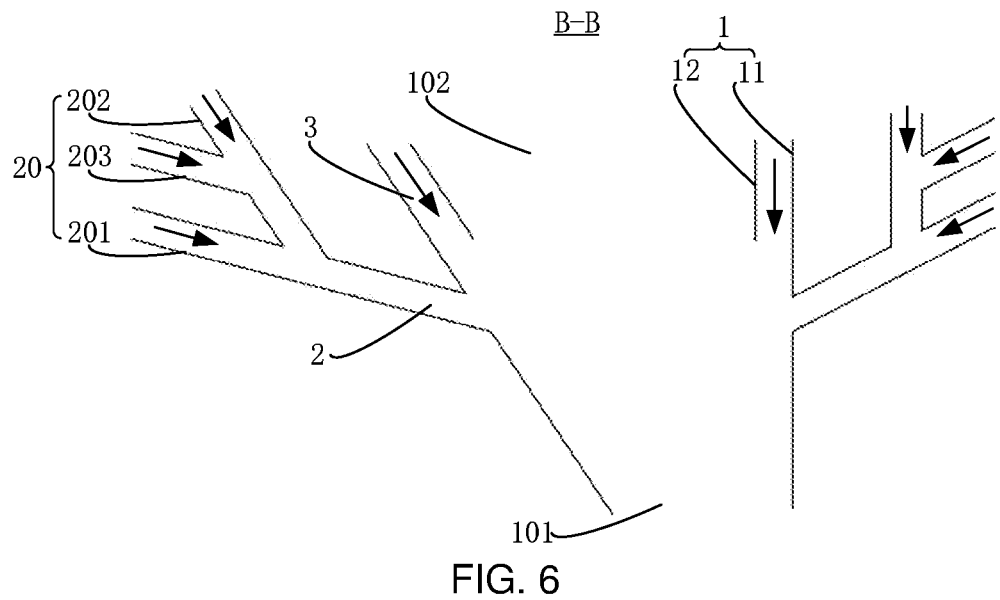
Figure 7:
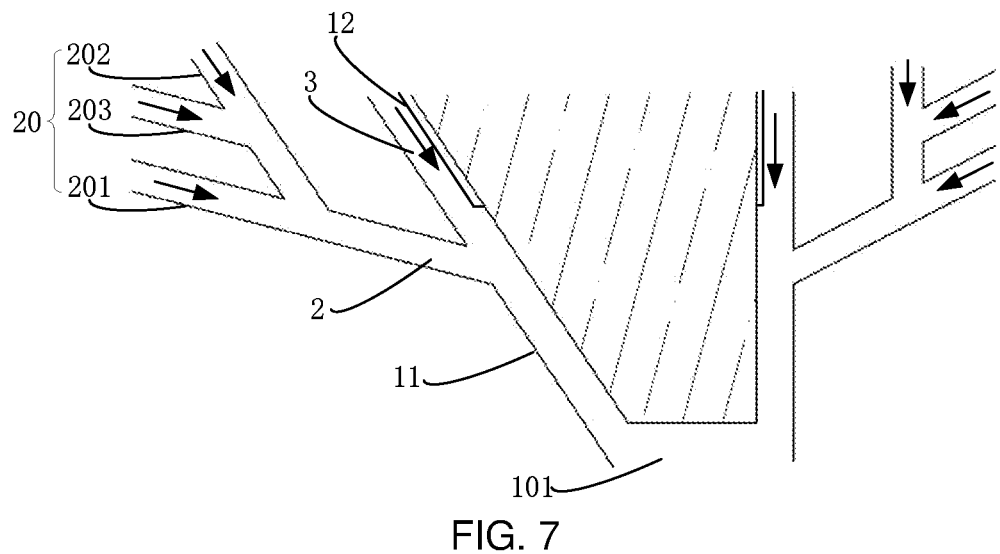
FIG. 7 is a schematic diagram of a state of use of the cleaning device according to an exemplary embodiment.

FIG. 1 is a schematic structural diagram of a cleaning device according to an embodiment of the present disclosure. FIG. 2 is a top view of FIG. 1 according to an exemplary embodiment. FIG. 3 is a view of FIG. 2 from a perspective of A according to an exemplary embodiment. FIG. 4 to FIG. 6 are each a cross-sectional view of the cleaning device along B-B according to an exemplary embodiment. FIG. 7 is a schematic diagram of a state of use of the cleaning device according to an exemplary embodiment. The cleaning device of the nozzle and the method of cleaning the nozzle provided in the present disclosure are described below with reference to the accompanying drawings and specific implementations by using an example in which a developing nozzle of a developer spray system is an object to be cleaned.

With reference to FIG. 1 to FIG. 4, the cleaning device of the nozzle in the embodiments of the present disclosure includes a body 1 and at least one row of first runners 2.

As shown in FIG. 1, the body 1 is configured to surround the nozzle and is close to the nozzle, and the body 1 includes a body outlet 101 and a body inlet 102. For example, the body outlet 101 and the body inlet 102 are respectively located at the bottom and the is top of the body 1.

The body 1 has a relatively large volume to accommodate the nozzle. Further, in some embodiments, a shape of the body 1 may match a shape of the nozzle, such that the body 1 can be equivalently close to surfaces of the nozzle, thereby improving cleaning efficiency and reducing cleaning costs. The nozzle to be cleaned enters the body 1 through the body inlet 102 for cleaning.

As shown in FIG. 1 to FIG. 4, the first runners 2 are configured to introduce a cleaning agent, the first runners 2 are arranged along an outer circumference of the body 1, an outlet of each of the first runners 2 communicates with the body 1, and a cleaning position is formed at the outlet of the first runner 2. In this way, the cleaning agent dynamically cleans a circumferential surface of the nozzle located in the body 1, such that the cleaning agent can be accurately aligned with contaminants on the surface of the nozzle to improve a cleaning effect through a chemical action and physical impact and is then discharged through the body outlet 101.

In an embodiment, one row of first runners 2 may be provided, or multiple rows, such as two rows, three rows, or five rows, of first runners 2 may be provided at intervals along a height direction (along a direction from the body inlet to the body outlet). Flow rates of the cleaning agent in the multiple rows of first runners 2 may be the same. In some embodiments, these flow rates may be different. For example, the flow rates may gradually decrease along a direction of the body outlet 101. When the flow rates decrease downward along the direction of the body outlet 101, an impact force of the flow rate of the cleaning agent on the surface of the nozzle decreases, such that cleanliness is improved by repeatedly cleaning the surface of the nozzle, and an impact on the nozzle at a position closer to the nozzle is smaller, thereby maintaining stability of the nozzle.

In the embodiment shown in FIG. 5, the cleaning device of the embodiments of the present disclosure further includes a second runner 3 arranged along an inner circumference of the body 1 and configured to introduce a drying agent. In this way, the drying agent is closer to the surface of the nozzle to dry the cleaned nozzle. In this embodiment of the present disclosure, a flow direction of the drying agent can be well controlled, and the drying agent can be blown from the top of the nozzle to form an environment of a positive or negative pressure in the body 1, to blow dry a residual liquid remaining on the surface of the nozzle under action of an external force and the gravity. In some embodiments, the drying agent may be, for example, a gaseous drying agent with excellent stability such as nitrogen or clean air.

As shown in FIG. 5, an outlet of the second runner 3 communicates with the body 1 to ensure fast drying of the surface of the nozzle in the body 1. The drying agent enters the body 1 through the second runner 3 to dry the nozzle in the body 1 and is then discharged through the body outlet 101.

As shown in FIG. 5, when the cleaning device of the embodiments of the present disclosure includes the first runner 2 and the second runner 3, the outlet of the first runner 2 is lower than that of the second runner 3, to ensure that the drying agent adequately dries the surface of the nozzle and prevent the cleaning agent from splashing during dynamic cleaning or from causing a residue of the cleaning agent after the cleaning, thereby fulling ensuring a cleaning effect on the nozzle.

As shown in FIG. 5, in an exemplary embodiment, the cleaning agent includes a liquid cleaning agent or a gaseous cleaning agent, that is, a liquid cleaning agent or a gaseous cleaning agent may be introduced into the first runner 2 to dynamically clean the nozzle located in the body 1. For example, for a developing nozzle of a developer spray system, the liquid cleaning agent may include at least one of the following cleaning agents: a developer with a mass percentage of 2% to 40%, a surfactant, pure water, and the like; and the gaseous cleaning agent may be an inert gas or nitrogen. The liquid cleaning agent in this range can favorably remove contaminants on the surface of the nozzle. The surfactant may be optionally a nonionic surfactant. The nonionic surfactant has excellent surface activity and a unique molecular structure, with no metal ion impurities introduced, and can ensure a cleaning effect. For example, optionally, the nonionic surfactant may be an alkoxylated surfactant, a fatty acid ester surfactant, an amide surfactant, and an alcohol based surfactant.

In other embodiments, the cleaning agent may alternatively include both a liquid cleaning agent and a gaseous cleaning agent. For example, the liquid cleaning agent and the gaseous cleaning agent may be alternately introduced into the first runner 2 first, to is dynamically clean the nozzle by alternately using the liquid cleaning agent and gaseous cleaning agent. The gaseous cleaning agent can prevent the liquid cleaning agent from causing a residue on the surface of the nozzle, thereby improving a cleaning effect.

As shown in FIG. 1 to FIG. 5, according to the cleaning device provided in the embodiments of the present disclosure, the body inlet 102 located in a lower position and the first runner 2 located higher than the body outlet 101 are provided, such that fluidity of the liquid cleaning agent and the gaseous cleaning agent during cleaning can be achieved and dynamic cleaning of a one-way flow can be achieved, thereby preventing impurities such as particles cleaned off the nozzle from remaining on the surface of the nozzle, ensuring a cleaning effect, ensuring cleanliness of the surface of the nozzle, and thus ensuring a product yield of the production; and improving cleaning efficiency, and thus improving production efficiency.

During actual cleaning, a position of the outlet of the first runner 2 matches a position of the nozzle in the body 1 to form the cleaning position. For example, the position of the nozzle is moved up and down to maintain a position to be cleaned at the position of the outlet of the first runner 2. In some embodiments, the cleaning position may be higher than a part to be cleaned of the surface of the nozzle. When there are multiple rows of first runners 2, it means that a cleaning position of the uppermost row of first runners 2 is higher than the part to be cleaned of the surface of the nozzle. For example, during actual production, the mixture on a wafer surface splashes and adheres to a region around a developing nozzle at a height no higher than half a height of the developing nozzle. In this case, during cleaning of a sidewall of the developing nozzle, a position from which the developing nozzle enters the body 1 is a position above the outlet of the developing nozzle and at a height at least half of which is lower than the outlet of the first runner 2, to ensure adequate cleaning of the developer splashing around the developing nozzle, thereby ensuring cleanliness of the developing nozzle.

As shown in FIG. 5, in the cleaning device provided in the embodiments of the present disclosure, the body 1 includes a first sidewall 11 and a second sidewall 12, and a hollow channel between the first sidewall 11 and the second sidewall 12 forms an inlet of the second runner 3. The outlet of the first runner 2 is located on the first sidewall 11 and provided lower than the inlet of the second runner 3.

As shown in FIG. 5, in this embodiment of the present disclosure, the body outlet 101 of the body 1 is formed at the bottom of the first sidewall 11, the body inlet 102 of the body 1 is formed at the top of the second sidewall 12, and the inlet of the nozzle is formed at the bottom of the second sidewall 12. The body inlet 102, the inlet of the nozzle, and the body outlet 101 communicate with one another. The nozzle enters the body 1 after sequentially passing through the body inlet 102 and the inlet formed at the bottom of the second sidewall 12, and the nozzle is dynamically the cleaned by using the cleaning agent. After the cleaning, the cleaning agent carries cleaned particles and other impurities and is discharged through the body outlet 101. The body outlet 101 may communicate with a post-processing device (not shown in the figure), and the used cleaning agent is purified or recycled by the post-processing device to avoid environmental contamination, save energy, and reduce production costs.

As shown in FIG. 5, in the cleaning device provided in the embodiments of the present disclosure, the first sidewall 11 is of a ring structure whose shape matches the shape of the nozzle, for example, a ring structure whose cross section is rectangular, and an outer dimension of the first sidewall 11 is greater than an outer dimension of the nozzle. In this way, the liquid cleaning agent and/or the gaseous cleaning agent that enters the body 1 through the first runner 2 flows between the first sidewall 11 and the developing nozzle to the body outlet 101, to achieve a one-way flow of dynamic cleaning of the nozzle.

In other embodiments, if the nozzle is of a cylinder structure or a circular truncated cone structure, the first sidewall 11 may be provided to be a cylinder structure or a circular truncated cone structure for matching, such that the first sidewall 11 matches the structure of the nozzle while surrounding the nozzle to be cleaned, to ensure a cleaning effect of the nozzle.

For example, a shape of the body inlet 102 matches the shape of the nozzle. For example, the second sidewall 12 is of a ring structure, and a shape structure of the second sidewall 12 matches the shape structure of the nozzle. In other words, a shape of a longitudinal section of the second sidewall 12 may be set according to a shape of a longitudinal section of the nozzle. For example, as shown in FIG. 1 and FIG. 4, the is longitudinal section of the nozzle is of a trapezoidal structure. In this case, the longitudinal section of the second sidewall 12 is also of a trapezoidal structure in a corresponding direction, and an inner wall dimension of the ring structure of the second sidewall 12 is larger than the outer dimension of the nozzle.

For example, in this embodiment of the present disclosure, the outlet of the first runner 2 and/or the outlet of the second runner 3 each may be a ring structure provided along a circumference of the first sidewall 11, to ensure that the liquid cleaning agent and/or the gaseous cleaning agent flowing out through the first runner 2 and the drying agent flowing out through the second runner 3 can adequately clean and dry the surface of the nozzle to ensure a cleaning effect. In addition, provision of too many openings on the body 1 can be avoided, thereby ensuring that the cleaning agents and the drying agent are all aligned with impurities attached to a surface of a portion to be cleaned, and avoiding inadequate cleaning.

In an exemplary embodiment, a direction of the outlet of the first runner 2 is inclined with respect to the body 1, and the direction of the outlet of the first runner 2 and an inlet direction of the body inlet 102 is at an acute angle. The cleaning agent flowing out through the first runner 2 may be in contact with the surface of the nozzle in an inclined state, to ensure a cleaning effect, and avoid reverse splashing on an outer wall of the nozzle to prevent the cleaning effect from being affected. A direction of the outlet of the second runner 3 is parallel with respect to a direction of the inlet of the body 1. The drying agent flowing out through the second runner 3 is close to and parallel to a sidewall of the nozzle, and a residual cleaning agent is easily carried away under action of an external force and the gravity.

As shown in FIG. 5, in an exemplary embodiment, the top of the first sidewall 11 is connected to the top of the second sidewall 12. When the second runner 3 is included, the inlet of the second runner 3 is provided between the top of the first sidewall 11 and the top of the second sidewall 12. The first sidewall 11 and the second sidewall 12 may be of a separate structure or an integrally formed structure.

In an exemplary embodiment, at least two connection portions are provided at intervals between the top of the first sidewall 11 and the top of the second sidewall 12. When the second runner 3 is included, a joint between two adjacent connection portions communicate with the body outlet 101 as the inlet of the second runner 3.

The first sidewall 11, the connection portion, and the second sidewall 12 may be of a separate structure. For example, the first sidewall 11 and the second sidewall 12 are of a separate structure, and the top of the first sidewall 11 and the top of the second sidewall 12 may be connected by at least two connection portions spaced apart.

The first sidewall 11, the connection portion provided between the first sidewall 11 and the second sidewall 12, and the second sidewall 12 may be of an integrated structure, for example, formed by bending forming, stamping forming, or in other manners. For example, the first sidewall 11 and the second sidewall 12 are integrally formed with a common top, and multiple air holes are provided at intervals between tops. When the second runner 3 is included, the multiple air holes may be used as inlets of the second runner 3, and a structure between two adjacent air holes is used as a connection portion.

For example, at least two connecting plates may be provided at intervals between the first sidewall 11 and the second sidewall 12. One side of the connecting plate in a width direction is connected to the first sidewall 11, and the other side is connected to the second sidewall 12. A length direction of the connecting plate is consistent with a flow direction of the gaseous cleaning agent. When the second runner 3 is included, a part between two adjacent connecting plates, the first sidewall 11, and the second sidewall 12 jointly form the second runner 3.

In the cleaning device provided in the embodiments of the present disclosure, when the second runner 3 is included, the outlet of the first runner 2 is provided on the first sidewall 11 and communicates with the body outlet 101 through the first sidewall 11.

In this exemplary embodiment of the present disclosure, the cleaning agent includes a developer, pure water, and a surfactant, and a mass percentage of the developer is 2% to 40%.

During actual application, the liquid cleaning agent flowing out through the first runner 2 may have a single component or include multiple components. Referring to FIG. 6 and FIG. 7, to facilitate control of a component and an amount of the liquid cleaning agent, the first runner 2 further includes at least one flow passage 20 configured to introduce the cleaning agent, and an outlet of each flow passage 20 communicates with the outlet of the first runner 2. According to actual clean requirements, different liquid cleaning agent components may be set in different flow passages 20.

As shown in FIG. 4 and FIG. 5, in the embodiments of the present disclosure, when the first runner 2 includes one flow passage 20, these cleaning agents may be sequentially circulated through the flow passage 20. In some other embodiments, as shown in FIG. 6 and FIG. 7, the first runner 2 may include multiple flow passes, for example, a developer flow passage 201, a water flow passage 202, and a surfactant flow passage 203, respectively used to circulate a developer, pure water, and a surfactant, to achieve an automatic cleaning process. When the first runner 2 includes multiple flow passages, the multiple flow passages are integrated into one runner. In this way, it can be ensured that these cleaning agents always clean the nozzle from a same cleaning position, without causing inconsistent cleaning heights.

In some embodiments, when various cleaning agents are separately circulated through multiple flow passages sequentially, in order to prevent a cleaning agent used last time from contaminating a cleaning agent to be used next time, and to complete the cleaning of the first runner 2, these multiple flow passages may be arranged according to different outlet heights. For example, as shown in FIG. 6 and FIG. 7, an outlet of the water flow passage 202 is higher than an outlet of the developer flow passage 201, and an outlet of the surfactant flow passage 203 is located between the outlet of the water flow passage 202 and the outlet of the developer flow passage 201. During actual application, the developer, the surfactant, and the pure water are sequentially used to clean the developing nozzle. In this way, it can be ensured that in each cleaning process, the last step of cleaning with the cleaning agent is to perform cleaning by using the pure water through the first runner 2, such that the interior of the first runner 2 is cleaned while a cleaning effect of the developing nozzle is ensured, thereby ensuring cleanliness inside the first runner 2.

According to the cleaning device of the nozzle provided in the embodiments of the present disclosure, a one-way flow of cleaning of the nozzle is achieved to improve cleaning efficiency and a cleaning effect, and the composition and amount of the liquid is cleaning agent can be selected according to a level of difficulty in cleaning the nozzle, to further ensure the cleaning effect, thereby ensuring a product yield and improving economic benefits.

Figure 8:
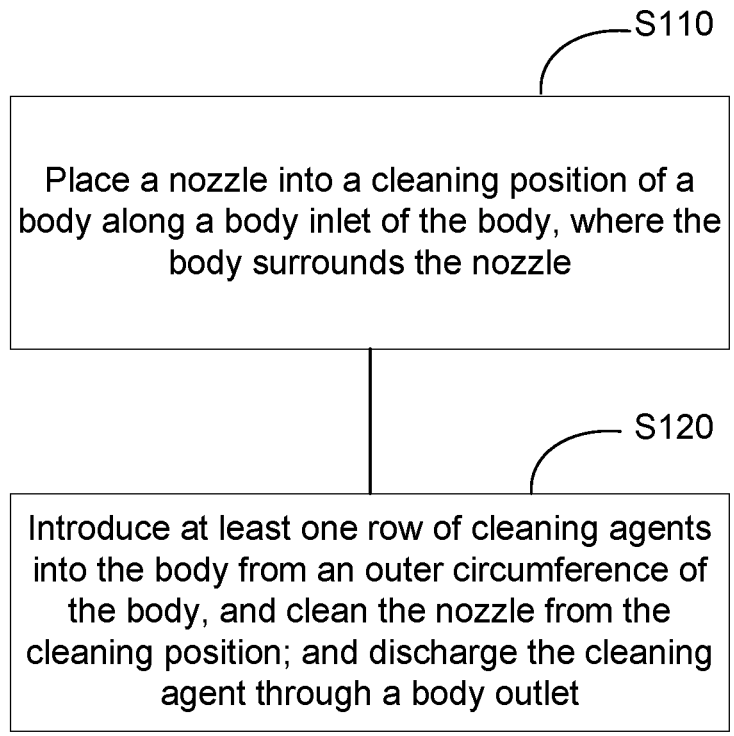
FIG. 8 is a flowchart of a cleaning method according to an exemplary embodiment.

An embodiment of the present disclosure further provides a method of cleaning a nozzle for automatic cleaning. The method of cleaning a nozzle is performed by the cleaning device described above. FIG. 8 is a flowchart of a cleaning method according to an exemplary embodiment. With reference to FIG. 1 to FIG. 5, the method of cleaning a nozzle provided in this embodiment of the present disclosure includes:

Step S110. Place the nozzle into the cleaning position of the body 1 along the body inlet 102 of the body 1, where the body 1 surrounds the nozzle.

Step S120. Introduce at least one row of cleaning agents into the body 1 from the outer circumference of the body 1, and clean the nozzle from the cleaning position; and discharge the cleaning agent through the body outlet 101.

For example, for a developing nozzle of a developer spray system, by operating the developer spray system, the nozzle to be cleaned thereof is moved into the body 1, and a position of the nozzle is adjusted, such that the position of the nozzle to be cleaned can be slightly lower than the cleaning position, that is, the position of the outlet of the first runner 2 of the cleaning device. Subsequently, a cleaning operation is performed to introduce the cleaning agent into the first runner 2 to be in the cleaning position, to clean a circumferential surface of the nozzle.

When there are multiple rows of first runners 2, the multiple rows of first runners 2 are arranged side by side along the height direction. Flow rates of the leaning agent in multiple first runners 2 may be the same or different. For example, in the direction along the body outlet 101, the cleaning agent in each row of first runners 2 is set in a manner in which the flow rates gradually decrease, because a higher flow rate indicates a larger impact force of the cleaning agent on the portion to be cleaned. As the cleaning agent flows and rinses, a lower position in the portion to be cleaned corresponds to a lower flow rate of the cleaning agent, and the portion is actually jointly cleaned by the cleaning agent in the multiple first runners 2. This improves cleanliness after the cleaning and also can further protect stability of the nozzle, thereby avoiding excessive impact damage or deformation of the nozzle caused by an extremely high flow rate of the cleaning agent.

In this embodiment of the present disclosure, the cleaning agent may include only a liquid cleaning agent or a gaseous cleaning agent, or may include both a liquid cleaning agent and a gaseous cleaning agent, and the liquid cleaning agent and the gaseous cleaning agent are alternately introduced into the first runner 2.

In step S110, the nozzle is placed into the body 1 after sequentially passing through the body inlet 102 and the inlet formed at the bottom of the second sidewall 12, and it is ensured that the surface of the nozzle is lower than the outlet of the second runner 3.

In this embodiment of the present disclosure, for example, a cleaning duration and a cleaning flow rate may be set according to cleaning frequency and the level of difficulty in cleaning of the nozzle. For example, the cleaning duration may be selectively set to 1 s to 20 s. For example, in step S120, a liquid cleaning agent with a preset concentration, a preset composition, and a preset flow rate is selected, and the liquid cleaning agent is introduced into the first runner 2 for 1 s to 20 s, for example, 10 s or 12 s, and then the operation is terminated. For another example, in step S120, a liquid cleaning agent with a preset concentration, a preset composition, and a preset flow rate is first selected, and the liquid cleaning agent is introduced into the first runner 2 for 1 s to 20 s, for example, 8 s or 9 s; and then a gaseous cleaning agent with a preset composition, a preset pressure, and a preset flow rate is selected and introduced into the first runner 2 for 1 s to 10 s, for example, 10 s.

In the method of cleaning a nozzle provided in this embodiment of the present disclosure, the body surrounds the nozzle, and the nozzle is dynamically cleaned in a one-way flow by using the cleaning agent circulating in the first runner 2, such that a cleaning effect fully ensured, thereby improving cleaning efficiency and a product yield.

Figure 9:
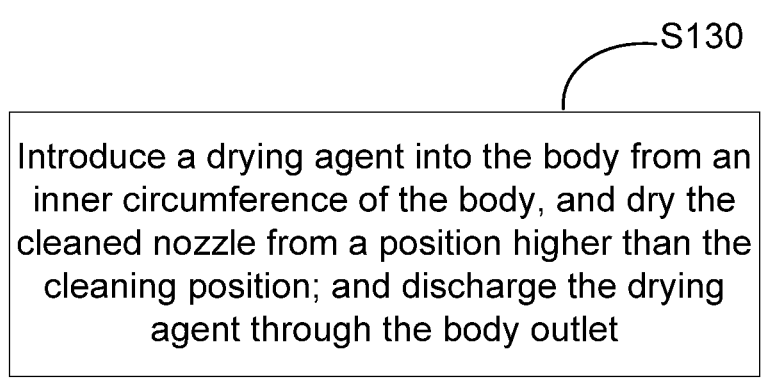
FIG. 9 is a supplemental flowchart of a cleaning method according to an exemplary embodiment.

FIG. 9 is a supplementary flowchart of a cleaning method according to an exemplary embodiment. Referring to FIG. 1 to FIG. 3, FIG. 5, and FIG. 9, after step S120, the method further includes:

Step S130. Introduce a drying agent into the body 1 from an inner circumference of the body 1, and dry the cleaned nozzle from a position higher than the cleaning position; and discharge the drying agent through the body outlet 101.

The drying agent is introduced into the second runner 3 of the cleaning device, and the to-be-cleaned portion after cleaning is dried by using the drying agent, to prevent the cleaning agent from affecting the cleaning effect due to any residue on the surface of the nozzle.

In this embodiment of the present disclosure, a drying duration may be set according to a concentration, a composition, and the like of the cleaning agent. For example, the drying duration may be set to 2 s to 30 s. For example, in step S130, a gaseous drying agent with a preset pressure of, for example, 5 Pa to 40 Pa and a preset flow rate of, for example, 100 ml/min to 1000 ml/min is selected and introduced into the second runner 3 for 2 s to 30 s, for example, 12 s, 16 s, or 18 s, and then a cleaning process is terminated. For example, the gaseous drying agent may be selectively nitrogen, and the nitrogen with a pressure of 32 Pa is introduced into the second runner 3 at a flow rate of 560 ml/min for a duration of 12 s.

According to the method of cleaning a nozzle provided in this embodiment of the present disclosure, the nozzle is dynamically cleaned in a one-way flow by using the liquid cleaning agent, and then the residual liquid cleaning agent is cleaned by using the gaseous drying agent in a one-way manner, to fully ensure a cleaning effect, thereby improving cleaning efficiency and a product yield.

Figure 10:
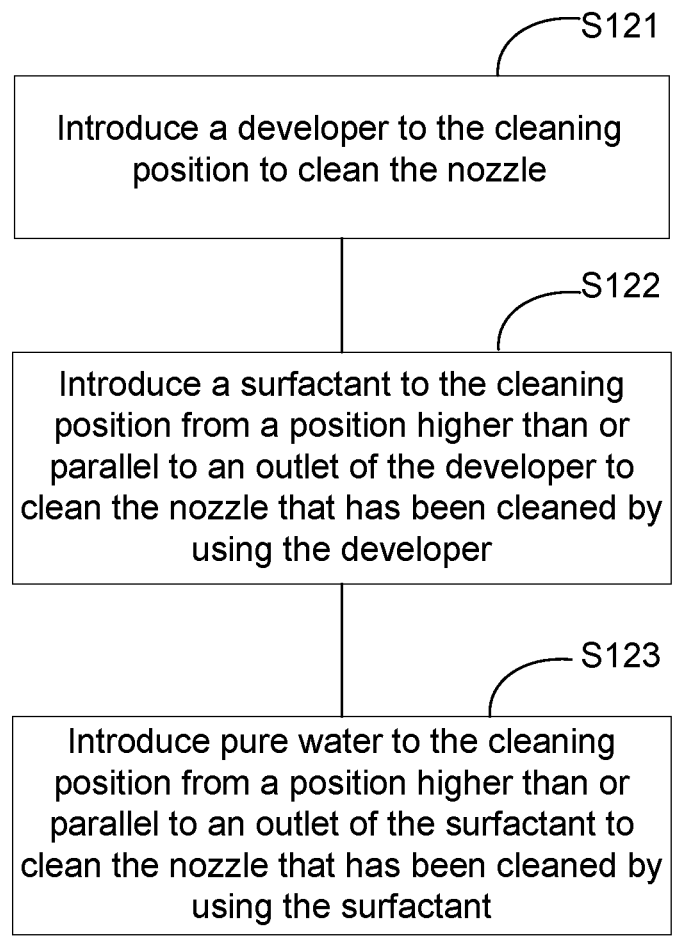
FIG. 10 is a flowchart of a cleaning method according to an exemplary embodiment.

As shown in FIG. 10, in some embodiments, for example, a developing nozzle of a developer spray system is used as an object to be cleaned, and the cleaning agent is a developer with a mass percentage of 2% to 40%, pure water, and a surfactant. FIG. 10 is an implementation flowchart of cleaning a developing nozzle with a cleaning agent.

S121. Introduce the developer to the cleaning position to clean the nozzle.

S122. Introduce the surfactant to the cleaning position from a position higher than or flush with an outlet of the developer to clean the nozzle that has been cleaned by using the developer.

S123. Introduce the pure water to the cleaning position from a position higher than or flush with an outlet of the surfactant to clean the nozzle that has been cleaned by using the surfactant.

Referring to FIG. 5, FIG. 6, and FIG. 7, corresponding cleaning agents may be is introduced through one or more flow passages 201, 202, and 203 on the first runner 2 of the cleaning device. When there is only one flow passage, the cleaning agents may be sequentially introduced. In this case, outlet positions of the cleaning agents are the same. When the outlet positions of the flow passages 201, 202, and 203 are arranged according to different outlet heights, mutual contamination between the cleaning agents can be prevented, and automatic cleaning can be achieved. In addition, the first runner 2 can also be cleaned during the cleaning, thereby improving cleaning efficiency. It should be noted that, regardless of one or more flow passages 20, these are integrated into the first runner 2 and the cleaning agents enter the body 1 through the outlet of the first runner 2, so as to reduce formation of an excessive quantity of openings on the body 1. These cleaning agents always clean the nozzle from a same cleaning position, and these cleaning agents can be all aligned with contaminants on the surface of the nozzle, thereby avoiding problems of inconsistent cleaning height and inadequate cleaning.

As shown in FIG. 6 and FIG. 7, after the developing nozzle moves to the cleaning position in the body 1, a clean operation is performed, and step S121 is performed. The developer is introduced into the developer flow passage 201 and is then in the cleaning position through the first runner 2, to clean a circumferential surface of the nozzle to remove most of the contaminants. A mass percentage of the developer is 2% to 40%, for example, 4%, 10%, or 15%. Within this range, the developer can achieve a balance between the cleaning effect and economic costs.

In some embodiments, while the developing nozzle is cleaned by using the developer, the developing nozzle is caused to spray a developer from inside the developing nozzle, to prevent the developer for cleaning contaminates the interior of the developing nozzle. Further, in order to avoid contamination inside the developing nozzle, a concentration of the developer sprayed from the developing nozzle is greater than or equal to a concentration of the developer entering the cleaning position from the first runner 2. The concentration of the developer sprayed from inside the developing nozzle is a concentration of a developer used in a semiconductor manufacturing process, and the concentration of the developer entering the cleaning position should not be too high, so as to ensure a cleaning effect and reduce costs.

Subsequently, step S122 is performed, and the surfactant is introduced into the surfactant flow passage 203 and is then in the cleaning position through the first runner 2 to clean the nozzle that has been cleaned by using the developer. In this case, on the one hand, the surfactant can enhance the cleaning effect and effectively remove the contaminants that have not been cleaned off after the cleaning performed by using the developer. On the other aspect, the outlet of the surfactant is higher than the outlet of the developer, such that the developer used last time in the first runner 2 can be removed.

Subsequently, step S123 is performed, and the pure water is introduced into the water flow passage 202 and is in the cleaning position through the first runner 2 to clean the nozzle that has been cleaned by using the surfactant. In this case, in the last step of cleaning, not only the contaminants remaining on the surface of the developing nozzle are removed by using the pure water to complete the process of cleaning the developing nozzle, but also the outlet of the pure water is higher than the outlet of the surfactant, such that cleaning of the first runner 2 is also completed.

According to the method of cleaning the nozzle provided in the embodiments of the present disclosure, the body is provided with the first runner and the second runner, such that dynamic cleaning of the nozzle in a one-way flow can be achieved, thereby improving a cleaning effect and cleaning efficiency, and thus improving a product yield and production efficiency.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

According to the cleaning device of the nozzle and the method of cleaning the nozzle provided in the embodiments of the present disclosure, a flowing cleaning agent is used to adequately clean contaminants adhering to the exterior of the nozzle, and then a flowing drying agent is used to clean a liquid cleaning agent and other residues on the exterior of the nozzle, to achieve dynamic cleaning of a surface of the nozzle and ensure cleanliness of the surface of the nozzle, thereby ensuring a product production yield, improving cleaning efficiency, and thus improving production efficiency.

The invention claimed is:

1. A cleaning device of a nozzle, comprising:
a body, configured to surround a nozzle to be cleaned, wherein the body comprises a body inlet and a body outlet; and
at least one row of first runners, configured to introduce a cleaning agent, wherein the first runners are arranged along an outer periphery of the body, an outlet of each of the first runners communicates with the body, and a cleaning position is formed at the outlet of each of the first runners;
wherein each of the first runners further comprises at least one flow passage, configured to introduce the cleaning agent, wherein an outlet of each flow passage communicates with the outlet of a corresponding one of the first runners.

2. The cleaning device of claim 1, further comprising:
a second runner, configured to introduce a drying agent, wherein the second runner is arranged along an inner periphery of the body, and an outlet of the second runner communicates with the body; and
the outlet of each of the first runners is lower than the outlet of the second runner.

3. The cleaning device of claim 1, wherein the cleaning agent comprises at least one of a liquid cleaning agent or a gaseous cleaning agent.

4. The cleaning device of claim 2, wherein the body comprises a first sidewall and a second sidewall, and a hollow channel between the first sidewall and the second sidewall forms an inlet of the second runner.

5. The cleaning device of claim 4, wherein the first sidewall and the second sidewall are each of a ring structure.

6. The cleaning device of claim 2, wherein
a direction of the outlet of each of the first runners is inclined with respect to the body; or
a direction of the outlet of the second runner is parallel with respect to a direction of the body inlet.

7. The cleaning device of claim 1, wherein the nozzle to be cleaned is a developing nozzle of a developer spray system, the cleaning agent comprises a developer, pure water, and a surfactant, and a mass percentage of the developer is 2% to 40%.

8. The cleaning device of claim 7, wherein the at least one flow passage comprises:
a developer flow passage, configured to introduce the developer;
a water flow passage, configured to introduce the pure water, wherein an outlet of the water flow passage is higher than an outlet of the developer flow passage; and
a surfactant flow passage, configured to introduce the surfactant, wherein an outlet of the surfactant flow passage is located between the outlet of the water flow passage and the outlet of the developer flow passage.

9. The cleaning device of claim 2, wherein,
a direction of the outlet of each of the first runners is inclined with respect to the body; and
a direction of the outlet of the second runner is parallel with respect to a direction of the body inlet.

10. A method of cleaning a nozzle, comprising:
placing a nozzle to be cleaned into a body along a body inlet of the body, wherein the body surrounds the nozzle to be cleaned;
introducing cleaning agents into the body from at least one row of first runners arranged along an outer periphery of the body, wherein the cleaning agents are introduced through at least one flow passage integrated into each of the first runners, and the cleaning agents introduced by the at least one flow passage enter the body through an outlet of each of the first runners; and
cleaning the nozzle to be cleaned from a cleaning position formed at the outlet of each of the first runners, wherein the outlet of each of the first runners communicates with the body; and
discharging the cleaning agents through a body outlet of the body.

11. The method of cleaning a nozzle of claim 10, further comprising:
introducing a drying agent into the body from an inner periphery of the body, and drying the cleaned nozzle from a position higher than the cleaning position; and
discharging the drying agent through the body outlet of the body.

12. The method of cleaning a nozzle of claim 11, wherein the nozzle to be cleaned is cleaned by using the cleaning agents in an inclined state with respect to the body, and the cleaned nozzle is dried by using the drying agent in a parallel state with respect to the body inlet of the body.

13. The method of cleaning a nozzle of claim 10, wherein the at least one row of first runners is multiple rows of first runners through which the cleaning agents are introduced into the body, wherein a flow rate of the cleaning agents decreases gradually in each row along a direction of the body outlet.

14. The method of cleaning a nozzle of claim 10, wherein the nozzle to be cleaned is a developing nozzle of a developer spray system, the cleaning agents comprise a developer, pure water, and a surfactant, and a mass percentage of the developer is 2% to 40%.

15. The method of cleaning a nozzle of claim 14, wherein a process of cleaning the nozzle to be cleaned by using the cleaning agents comprises:
introducing the developer to the cleaning position to clean the nozzle to be cleaned;
introducing the surfactant to the cleaning position from a position higher than or flush with an outlet of the developer to clean the nozzle that has been cleaned by using the developer; and
introducing the pure water to the cleaning position from a position higher than or flush with an outlet of the surfactant to clean the nozzle that has been cleaned by using the surfactant.

16. The method of cleaning a nozzle of claim 14, wherein while the nozzle to be cleaned is cleaned by using the developer, the nozzle to be cleaned is caused to spray a second developer from inside the nozzle to be cleaned, wherein a concentration of the second developer sprayed from the nozzle to be cleaned is greater than or equal to a concentration of the developer in the cleaning position.

* * * * *